United States Patent [19]

Keller et al.

[11] Patent Number: 4,535,595
[45] Date of Patent: Aug. 20, 1985

[54] COOLING DEVICE FOR A LOW TEMPERATURE MAGNET SYSTEM

[75] Inventors: Tony W. Keller, Rheinstetten; Wolfgang Müller, Karlsruhe, both of Fed. Rep. of Germany

[73] Assignee: Bruker Analytische MeBtechnik GmbH, Rheinstetten-Forchheim, Fed. Rep. of Germany

[21] Appl. No.: 577,699

[22] Filed: Feb. 7, 1984

[30] Foreign Application Priority Data

Feb. 9, 1983 [DE] Fed. Rep. of Germany ....... 3304375
Mar. 8, 1983 [DE] Fed. Rep. of Germany ....... 3308157

[51] Int. Cl.³ ............................................. F25B 21/02
[52] U.S. Cl. .......................................... 62/3; 62/467; 62/514 R
[58] Field of Search ......................... 62/3, 514 R, 467

[56] References Cited

U.S. PATENT DOCUMENTS

| | | | |
|---|---|---|---|
| 2,704,431 | 3/1955 | Steele | 62/3 X |
| 3,364,687 | 1/1968 | Kolm | 62/514 X |
| 3,424,230 | 1/1969 | Wright, Jr. | 62/514 R |
| 3,588,312 | 6/1971 | Burnier | 62/514 R |
| 3,589,138 | 6/1971 | Severijns et al. | 62/514 R |
| 3,638,440 | 2/1972 | Lawless | 62/3 |
| 3,650,117 | 3/1972 | Robinson et al. | 62/3 |
| 3,788,088 | 1/1974 | Dehne | 62/467 X |

OTHER PUBLICATIONS

"A Portable 16.5 T Superconductive Magnet System for Shared Use", Hudson & Jones, Cryogenics, (Oct. 1976), p. 593.
"A Pumped Supercritical Helium Flow Loop for Heat Transfer Studies", Cairns & Brassington, Cryogenics, (Aug. 1976), p. 465.
"Nuclear Refrigeration of Liquid He³", Ahonen et al., Cryogenics, (Sep. 1976), p. 521.

Primary Examiner—Lloyd L. King
Attorney, Agent, or Firm—McCormick, Paulding & Huber

[57] ABSTRACT

A cooling apparatus for a low temperature magnet system includes a superconducting magnet coil (32) which encircles a test space (36). The magnet coil (32) is surrounded by at least one intermediate shield (26, 29) and is contained in an evacuated outer shell (22). On the outer shell (22) is a motor driven refrigerator (11) which actively cools the at least one intermediate shield (26, 29) by means of a cooling arm (18) extending through the outer shell (22). For compensating the disturbing fields emitted by the motorized drive of the refrigerator (11) a sensing device is provided for picking up these magnetic and/or mechanical disturbing signals. The sensor signal controls at least one coil (62) for compensating the disturbing field effective in the test space (36).

37 Claims, 6 Drawing Figures

COOLING DEVICE FOR A LOW TEMPERATURE MAGNET SYSTEM

The invention concerns a cooling device for a low temperature magnet system in which the magnet coil is contained in an evacuated outer jacket surrounded by at least one intermediate shield and in which a refrigerator is provided and arranged on the outer jacket, which refrigerator cools the at least one intermediate shield through a cooling arm passing through the outer jacket.

In different areas of measuring technology, especially analytical measurement and medical measurement, homogeneous magnetic fields of high field strength are required. For this, superconducting magnets are being employed in an ever increasing extent in place of classical iron magnets. These superconducting magnets consist essentially of a magnet coil, wound of superconducting wire, placed in a cryostat which keeps it at an operating temperature of about 4 K.

Customarily, in the mentioned applications solenoid coils are used which are located in a container for liquid helium. This container is surrounded by a further container filled with liquid nitrogen. Between these containers and, if necessary, between the nitrogen container and the outer jacket of the magnet system are arranged so called heat shields maintained at a temperature lying between the boundary temperatures and serving to pre-cool the inner-most container containing the liquid helium.

The superconducting coil has a current applied to it and then, in a known way, it is short-circuited so that the introduced current can flow practically endlessly in the superconducting coil so long as its superconductance is maintained.

The cost of driving such a superconducting magnet is decided by the consumption of the mentioned liquid gases, namely liquid nitrogen and liquid helium. If it is possible to keep the evaporation rate of these liquid gases to a low value the cost of driving a superconducting magnet can be kept low so that—in addition to the magnetic field properties—generally favorable conditions as to operating costs are possible in comparison with classical iron magnets.

To keep the evaporation rate of the liquid gas low it is known to attach a cooling system, customarily referred to as a refrigerator, to the outer shell of the superconducting magnet system. These known refrigerators make use of a cooling arm which extends through the outer shell of the cryostat until it reaches one or more inner containers or the protective shields and actively cools these. The cooling arm, or the cooling arm with one or further projecting cooling fingers, therefore keeps the inner containers or protective shields at such low temperatures that the evaporative loss of the liquid gases reaches an especially low value.

From the article by Yamamoto in the periodical "Review of Scientific Instruments", 50, pages 1382 to 1385, (1979) one such system is known in which a refrigerator is superimposed on a cryostat and actively cools inner protective shields of the cryostat by means of cooling arms of different length. The refrigerator is in this case rigidly connected with the cryostat.

Known refrigerators have a cooling head, arranged outside of the outer shell of the magnet system, containing a motorized drive with pistons or the like. This motorized drive is preferably driven by pressurized air delivered from a more remote stationary compressor through a flexible line. In this way the parts generally producing movements and vibrations are arranged far from the magnet system, but despite this there remains in the cooling head a row of motor driven elements which can lead to vibrations. The movable piston or pistons located in the cooling head have a direct effect on the magnetic field insofar as they set the superconducting magnet system into vibration, since through the movement of the metallic pistons disturbing fields are introduced.

Superconducting magnet systems of the above described kind are further preferably used for the measurement of magnetic resonances, for example magnetic nuclear resonance. In the case of high resolution measurements, which require an especially homogeneous magnetic field, disturbances of the mentioned kind produced by the motorized refrigerator drive have an especial effect because the motorized drive of the refrigerator works at relatively low frequencies and the disturbances originating from it cannot be rejected through customary stabilizing measures. This is also true in the case of the so called internal lock in which the magnet field is regulated with the help of a reference line of the nuclear resonance spectrum.

As already mentioned above, the named superconducting magnet system is kept in operation in "persistent mode", depending on circumstances, for years at a time. This is possible because the maintenance of the magnetic field in superconducting magnets is a loss free process, since because of the superconductance losses do not arise. On the other hand, the refrigerator in the named arrangement is subject to mechanical wear so that such a long operating time is not possible with refrigerators available today. Consequently it is necessary to mechanically inspect the refrigerators at definite time periods. For such an inspection it is moreover necessary to warm it to room temperature in order, for example, to be able to replace O-rings or other seals or to replace other mechanical parts. With known apparatus a mechanical disassembly of a refrigerator rigidly connected to a cryostat also leads to an interruption in operation since the refrigerator reaches into the evacuated portion of the cryostat; and a result of the dismantling of the refrigerator is that the vacuum cannot be properly maintained. Therefore, due to warming the superconducting coil transfers to the normal conducting state, so that the maximum achievable operating period in the "persistent mode" is limited by the mechanical service life of the refrigerator.

The invention has therefore as an object the provision of an apparatus which on one hand makes possible an especially low evaporation rate of the liquid gas by the use of a refrigerator, and which on the other hand avoids the described disadvantages resulting from the disturbances originating from the refrigerator.

This object is achieved in accordance with the invention by providing a sensor for detecting the magnetic and/or mechanical disturbance signals emitted by the motorized drive of the refrigerator, which sensor controls at least one winding or coil compensating for the disturbing field effective in the test space.

The inventive cooling device has the especial advantage in the case of high resolution nuclear resonance measurement that it permits the use of actively cooled protective shields.

In a preferred embodiment of the invention a detecting coil arranged in the vicinity of the refrigerator serves as the sensing device. This arrangement has the advantage that the disturbing signals are picked up where they are created. With this arrangement the disturbing signals received by the detecting coil are especially large.

In another additionally available embodiment of the invention a detecting coil is arranged in the area of the test space of the magnet system. This arrangement has the advantage that the disturbing signals are picked up where they are effective so that exactly those components of the disturbance which would lead to disturbances in the measurement can be compensated.

In the case of both mentioned arrangements an embodiment is preferred in which the disturbing signals are picked up in several different gradient directions. Thereby use is made of the fact that the reception and compensation of magnetic field inhomogeneities along predetermined magnetic field gradients is known and a number of algorithmic rules are available to generate corresponding magnetic field corrections.

In another embodiment of the invention, in which the refrigerator has a cooling head containing a motorized drive, the cooling head has a first flange which lies on a second flange which second flange in turn is connected to a neck formed on the outer shell of the magnet system. The detecting coil is preferably arranged in the area of this neck, especially as a solenoid coil coaxially receiving the neck. This arrangement yields an especially compact and mechanically stable construction. Also with this arrangement the detachability of the cooling head, for example for inspection, is not impaired.

Alternatively or additionally to the previously mentioned embodiments in which the electromagnetic disturbance field emanating from the refrigerator is picked up, in a preferred form of the invention a sensing device is used which picks up the mechanical disturbances produced by the refrigerator especially by measuring the acceleration or the vibration at a proper spot either on the refrigerator itself or on another point of the magnet system. This procedure has the additional advantage that mechanical disturbances from non-magnetic or non-metallic elements of the magnet system can also be picked up, which do not manifest themselves as electromagnetically measurable disturbances and as such hardly produce disturbing signals at the place of the detecting coil yet as mechanical signals are nevertheless measurable.

An especially good effect is achieved if an electronic control device is provided which conducts the output signal of the sensor to the coil serving for compensation purposes. Then the sensor signal can be correspondingly weighted, for example by being divided or multiplied according to what relationship exists between the measured disturbing signal and the compensation signal which is to be adjusted. Especially preferred in this case is an embodiment in which the sensor signal is modified by a characteristic line or graph since in doing this non-linear dependencies can be taken into consideration on one hand and on another hand changed measuring parameters can be suppressed. These measuring parameters can for example be the basic field strength, an extraneous gradient modulation, a test temperature or the like.

To compensate the disturbing field emitted by the refrigerator a correcting coil can be arranged at different points of the magnet system, so long as it is effective in the test space. Especially preferred in this case is an arrangement in which the correcting coil directly surrounds the test space. Thereby the disturbances emitted by the refrigerator are compensated at the spot at which they are effective.

Alternatively or additionally it is however also possible in preferred forms of the invention to arrange the correcting coil in the area of the refrigerator itself so that the disturbances are compensated at the place of their origin so that the disturbances are entirely no longer transmitted to the magnet system or if they are then only in greatly weakened form.

Proceeding from this last mentioned consideration, an arrangement is especially preferred in which a course compensation is provided by a correcting coil arranged in the area of the refrigerator and in which in a second subsequent step a fine compensation is made by means of a correcting coil arranged in the area of the test space. This two stage compensation leads to an especially effective result.

An especially good compensation is therefore possible if several correcting coils are arranged in different gradient direction so that—as already indicated above—a gradient compensation can be provided according to one of several known methods.

A further construction of the invention involves the fact that the duct through the outer shell is formed as a vacuum tight sliding apparatus.

The cooling apparatus of the invention has the especial advantage that the superconductance of the magnet coil can be maintained while the refrigerator is mechanically serviced. In accordance with the invention this is accomplished by maintaining the vacuum in the cryostat so that the magnet coil is continually maintained at the required operating temperature of 4 K. Therefore the cooling device of the invention unites the advantage of a low evaporation rate in the associated refrigerator with the advantage of a long operating time of the superconducting magnet system in the "persistent mode".

In preferred embodiments of the invention the cooling arm is arranged in a tube belonging to the refrigerator and slidable in a neck formed on the outer shell. Such an arrangement is especially advantageous because an effective seal can be made between the neck and the tube, using for example an O-ring and/or a bellows type sealing element which are available as standard parts and which make possible a good vacuum seal.

An especially good support of the refrigerator in its inserted condition is achieved if the refrigerator and the neck formed on the shell are provided with flanges which in the inserted condition of the refrigerator are positioned adjacent to one another and which in this position are connectable by threaded fasteners.

For a precise guiding and displacement between the refrigerator and the outer shell when moved relative to one another, in a preferred construction of the invention rods are provided as guides and displacement maintaining means, which rods are fastened to one of the flanges and slide in the other flange. Preferably, an index mark is provided to indicate the position of the displacement means corresponding to the moved out condition of the refrigerator. In this moved out condition the heat transfer between the cooled end section or the cooling finger of the arm of the refrigerator and the protective shield or the inner container of the cryostat is interrupted so that attainment of the mark shows that the service work can be carried out. In this way an especially simple start of the service work is possible.

If the refrigerator with its outwardly lying head containing the actual cooling means is connectable by threaded means through a flange to the flange of the tube, in the case of basic servicing during which the magnet system indeed must be taken out of operation, the refrigerator head with the cooling arm can be dismounted without having to disassemble the mechanical guide of the tube in the neck of the outer shell.

In especially preferred forms of the invention the cooling arm runs to an end section and from there into a finger reduced relative to the end section so that the end section and finger in the inserted condition of the refrigerator stand in mechanical connection with two intermediate shields lying below one another. If the end section and the finger are brought to different temperatures, with this arrangement, which is especially easily adjustably insertable, one can cool with the refrigerator two protective shields or internal containers lying below one another to different temperatures.

An especially good heat transference between the end section or finger and the intermediate shield to be cooled is created if the end section or finger is insertable in the intermediate shield. In this case the intermediate shield or container in the preferred form of the invention has a preferably cylindrical projection with a central bore whose diameter matches the outer diameter of the cooling arm or the cooling finger.

To ease the insertion of the cooling arm into this projection in accordance with the invention the bores and/or the end section or finger are provided with bevels at the faces facing one another.

An especially good effect is obtained by forming these coupling parts at the protective shield or container to include an elastic reception of the end section or finger so that an especially good heat transfer is obtained while at the same time giving an easy detachability for the removal of the refrigerator.

Preferably this elastic mounting is obtained by having the mentioned cylindrical projection of the coupling part provided with radial slots and/or the stationary part of the projection provided at its foot with a reduced cross-section so that it is elastic in the radial direction.

To reduce the time required for mechanically servicing the refrigerator in its pulled out state, which makes for a higher evaporation loss of the liquid gas during the service, in further accord with the invention a heating device is provided in the cooling arm with which it is possible to more quickly bring the temperature of the cooling arm or the refrigerator to a temperature at which the mechanical servicing, such as replacement of the sealing element, is possible. Preferably the heating device and the parts to be serviced are arranged in an area of the cooling arm which in the pulled out state of the refrigerator lies outside of the outer shell of the cryostat so that the effect of the heating device has as little as possible influence on the cooled inner parts of the cryostat.

Further advantages will be apparent from the description and the accompanying drawings.

The invention is represented in the drawings and is explained more specifically in the following description. The drawings are:

Figure 1:
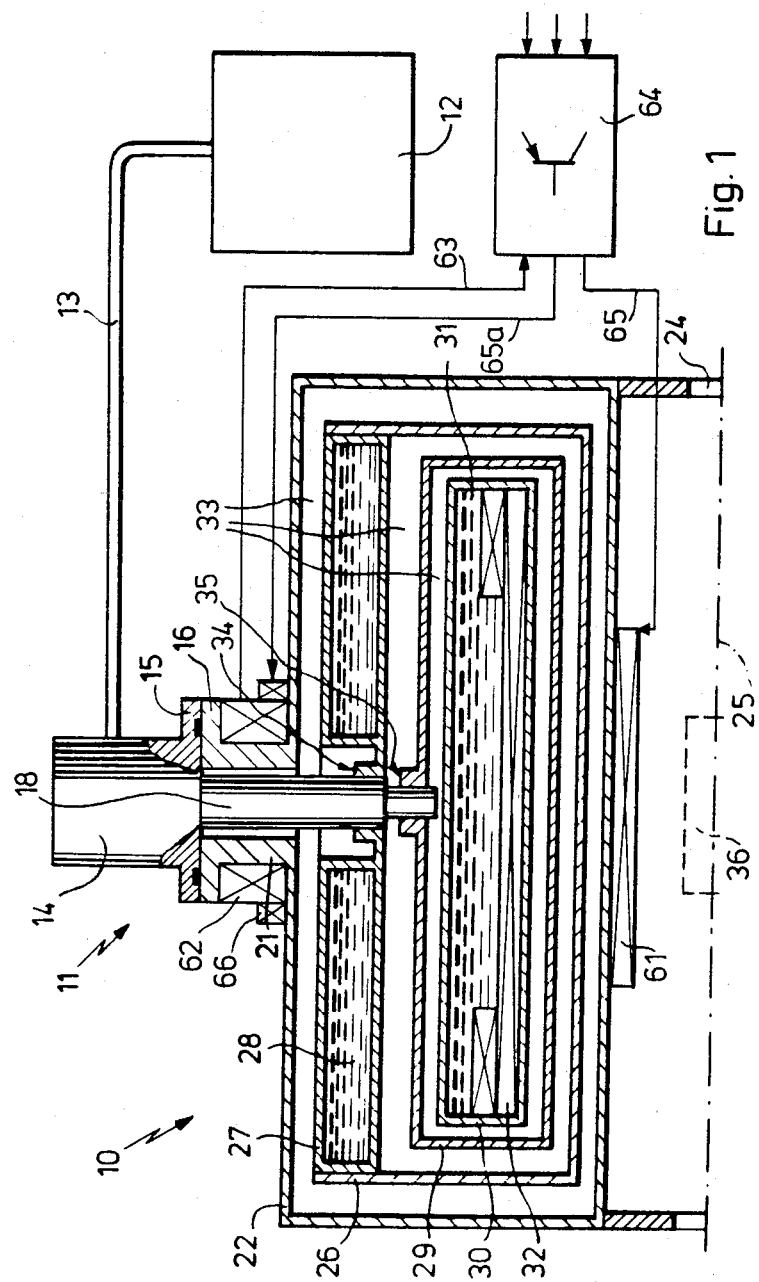
FIG. 1 is a cross-sectional view through one-half of a cryostat which is provided with one embodiment of a cooling device according to the invention.

FIG. 1 at 10 shows a superconducting magnet system using a refrigerator 11 for cooling interior protective shields or containers. The refrigerator 10 is supplied, for example with high pressure gas, through a flexible conduit 13 from a compressor 12 spaced from the refrigerator. The refrigerator 11 is made as an attachment consisting of a cooling head 14 as well as a first flange 15 formed on the head. The first flange 15 rests on a second flange 16 which transitions into a neck 21 surrounding a cooling arm 18 extending from the refrigerator 11. The neck 21 is formed on an outer shell 22 of the superconducting magnet system 10.

The outer shell 22 goes on the end sections of the superconducting magnet system 10, as a cover, with the end sections having a test opening 24 on the axis 25 of the magnet system. It will be understood that the illustration of FIG. 1 represents only one-half of the magnet system 10 which is formed so as to be generally rotationally symetric.

The outer shell 22 surrounds a first intermediate shield 26 standing in direct mechanical and therefore heat conducting contact with a container 27 containing liquid nitrogen 28. The first intermediate shield 26 surrounds a second intermediate shield 29 which is connected with no container for liquid gas. The second intermediate shield 29 surrounds however a container 30 for liquid helium 31. In the container 30, or in the liquid helium 31, is a magnet coil 32 shown in the illustrated case as a solenoid coil. The intermediate spaces 33 between the outer shell 22, the first intermediate shield 26, the second intermediate shield 29 and the container 30 are evacuated.

It will be understood that in the illustration of FIG. 1 fastening means and insulation foils (super insulation) which are known in the art, for the individual containers of the magnet system 10 are not shown.

In the interior of the test opening 24 a test space is indicated at 36 into which tests are brought for measurement with the magnet system 10, for example a test specimen on which high resolution nuclear resonance measurements are to be made.

To establish a heat transfer between the cooling arm 18 of the refrigerator 11 and the first intermedidate shield 26 and the second intermediate shield 29, which are to be cooled by the cooling arm, the shields 26, 29 are provided with coupling parts 34, 35.

Figure 2:
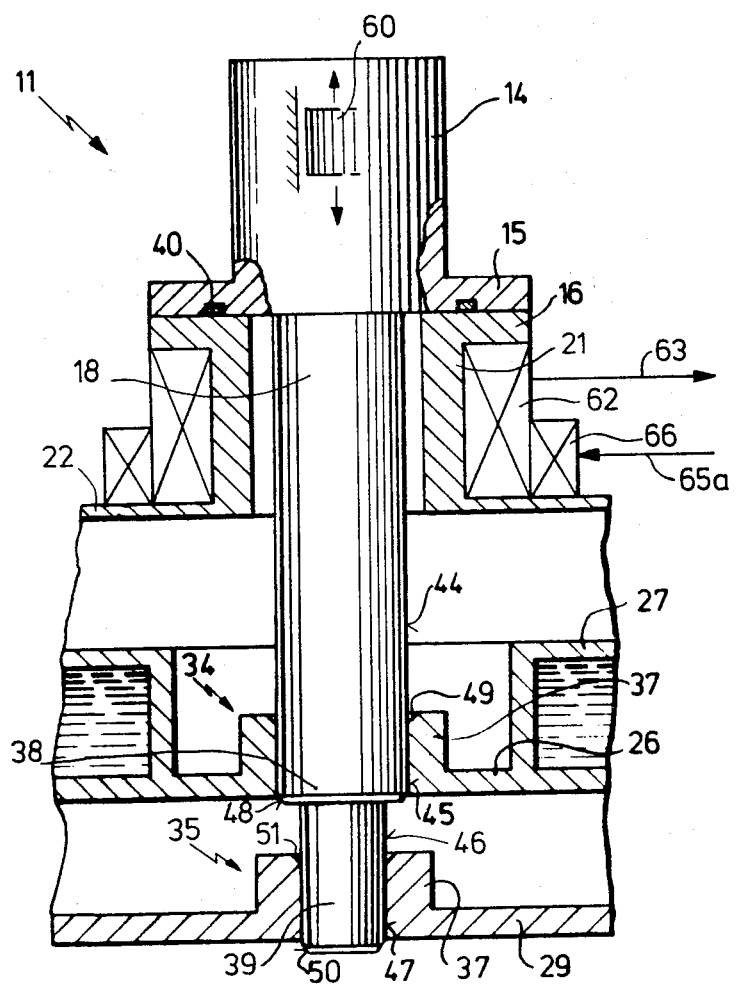
FIG. 2 is an enlarged view of a portion of FIG. 1.

Turning to the enlarged illustration of the refrigerator 11 and the associated parts of the magnet system 10 shown in Fig. 2, it is seen that the cooling arm 18 at its end facing the magnet coil 32 first has an end section 38 which then transitions to a concentric finger 39 having a reduced cross-section with respect to the end section 38.

As already mentioned, the cooling head 14 of the refrigerator 11 is provided with a first flange 15 which rests on the second flange 16 of the neck 21. To make an especially good seal between the flanges 15 and 16 a seal made with an O-ring 40 is provided between these two flanges.

The end section 38 is in heat conducting contact with the coupling part 34 and the finger 39 in heat conducting contact with the coupling part 35. The coupling parts 34 and 35 are formed as cylindrical projections 37 on the shields 26 and 29 through which projections central bores extend. The outer diameters 44 and 46 of the end section 38 and finger 39 and the inner diameters 45 and 47 of the projections 37 are of such sizes that they produce a good mechanical fit and therefore a good heat transfer between the mentioned parts. The end section 38 is brought to a temperature by the refrigerator 11 which is to be taken on by the first intermediate shield 26, for example a temperature of 80 to 100 K, while the finger 39 is cooled to the temperature to be taken on by the second intermediate shield 29, for example a temperature of 20 to 50 K.

To facilitate the insertion of the end section 38 and finger 39 in the coupling parts 34 and 35 the forward faces of the end section 38 and finger 39 are provided with bevels 48 and 50 while the outwardly facing faces of the projections 37 are provided with bevels 49 and 51.

It will therefore be understood that the materials used, especially for the coupling parts 34, 35, are so chosen that the parts have especially good heat conductance at low temperatures.

In the cooling head 14 of the refrigerator 11 is a motorized drive indicated by a movable piston 60 in FIG. 2. Naturally, along with the piston 60 the cooling head 14 has other movable parts, for example a piston rod, crank shaft and the like. These mechanically moving parts of the motorized drive in two respects produce disturbances in the operation of the magnet system 10. For one thing the movement of the metallic portions directly produce an induced magnetic field, and for another thing the movement of the massive portions produce vibrations on the magnet system 10. This is especially critical in the present case since the cooling arm 18 extends directly away from the cooling head 14 and has a rigid mechanical connection through the end section 38 with the coupling part 35 and through the finger 39 with the coupling part 35 to the intermediate shields 26, 29 having direct proximity to the magnet coil. Vibrations originating in the area of the cooling head 14 are therefore directly planted in the direct proximity of the magnet coil 32.

For compensating these disturbances a correcting coil 61 surrounding the test space 36 is provided in the test opening 24. The supply signal for the correcting coil 61 is obtained from a detecting coil 62, which in the embodiment illustrated by the Figures is a solenoid coil surrounding the neck 21. The output signal of the detecting coil 62 is transmitted through a conductor 63 to an electronic control device 64 which feeds the correcting coil 61 through a conductor 65. For example, the electronic control device 64 can amplify the signal from the detecting coil 62 or can attenuate it by a predetermined factor, that is altogether weighted, if such a linear relationship of the measured signal to the correcting signal is adequate. It will be understood, however, that it is also possible, in case of a non-linear dependency to provide a characteristic line or curve in the control device 64 if one or more of certain influences are to be taken into consideration. In using a characteristic curve parameters of the control device 64 can also be taken into account, such as for example the employed basic field strength, extraneous modulation frequencies, a test temperature or the like.

In any event, the signal obtained from the detecting coil 62 is converted to a correcting signal according to a pregiven relationship and the correcting coil 61 is energized with this correcting signal.

While in the above described arrangement the disturbances from the refrigerator 11 are detected by the detecting coil 62 at the place from which they originate, in accordance with the invention these disturbances naturally can also be detected in any other suitable place, especially at the test location 36.

Similarly the correction of the disturbing fields can take place not only, as shown in FIG. 1, at the test location 36 through the correcting coil 61 but in accordance with the invention the disturbances may be compensated at the place from which they originate. In this connection, according to the embodiment of FIG. 2, a further correcting coil 66 is arranged coaxially around the detecting coil 62, which correcting coil 66 is controlled by the electronic control device 64 through the conductor 65a. The same considerations as given above for the signal supplied to the correcting coil 61 also serve for the signal supplied to the correcting coil 66. That is, the correcting coil 66 is controlled in dependence on a correcting signal provided from the control device 64 which is produced from the signal emitted by one of the detecting coils, for example the detecting coil 62.

In this case an especially preferred embodiment is obtained in which a coarse compensation is made in the area of the refrigerator 11 through the conductor 65a and the correcting coil 66 and subsequently in a second step a fine compensation is accomplished by means of the correcting coil 61 in the area of the test location 36.

Since the disturbances emitted by the refrigerator do not propagate in only one direction but instead have several arbitrary paths, in a further form of the invention several detecting and/or correcting coils are provided at one or more places so that the individual coils are effective in definite gradient directions corresponding to their arrangement. Such plural coil arrangements are known in themselves and are moreover referred to as "shim-coils" whereby each individual or pair of such shim-coils is provided for compensating a known magnetic field gradient.

Figure 3:
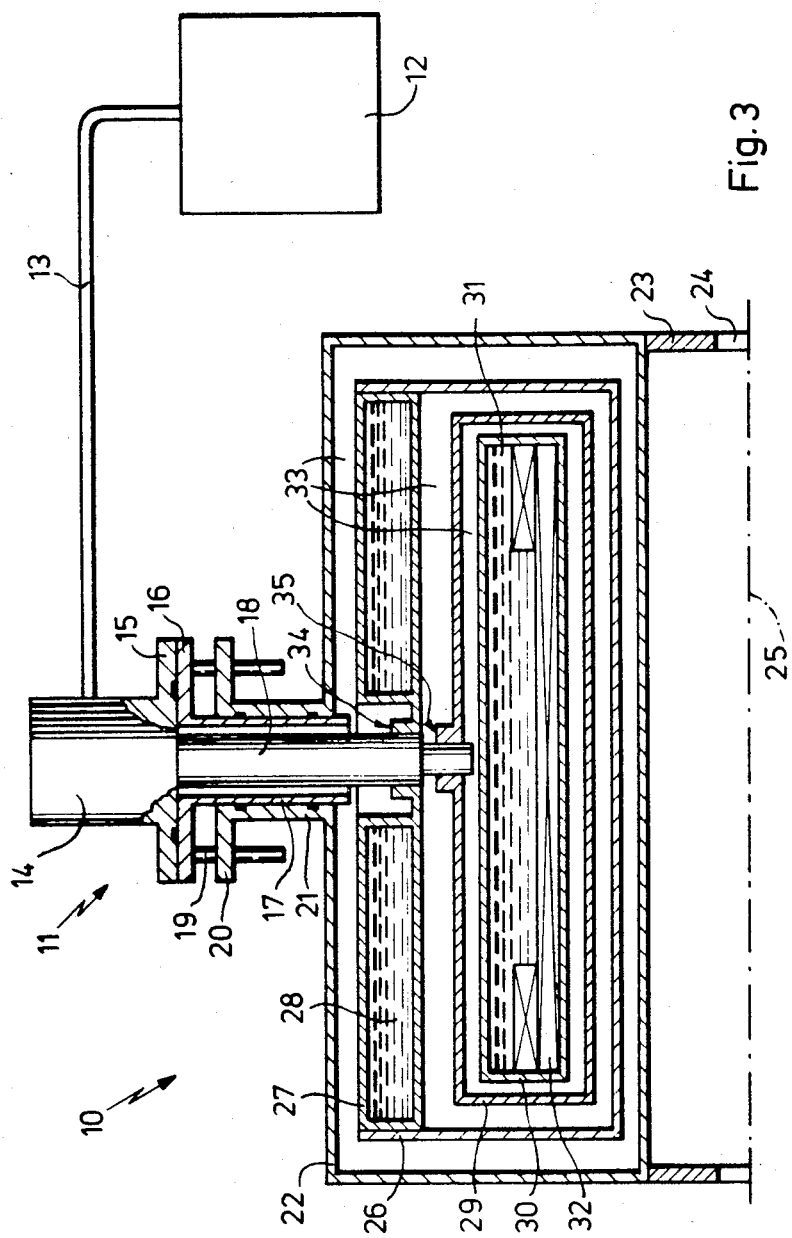
FIG. 3 is a cross-sectional view through one-half of a cryostat which is provided with a cooling device comprising another embodiment of the invention.
Figure 4:
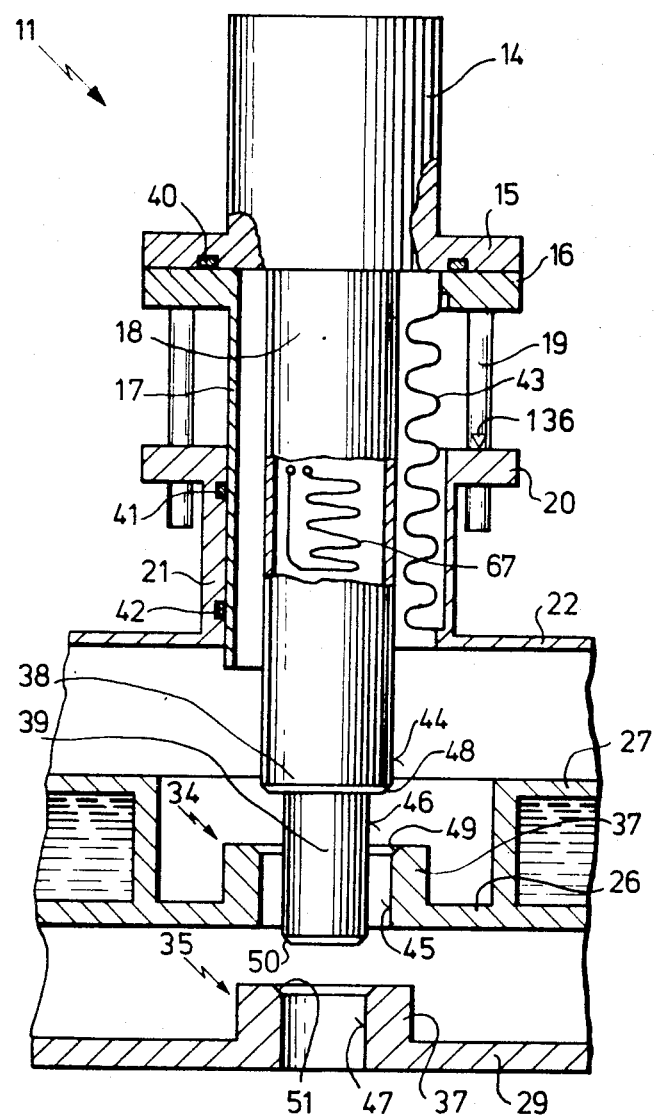
FIG. 4 is an enlarged view of a portion of FIG. 3.

In FIGS. 3 and 4 the refrigerator 11 is shown as an attachment and it consists of the head 14 having the first flange 15 formed thereon. The first flange 15 rests on the second flange 16 which transitions into a tube 17 surrounding the cooling arm 18 extending from the refrigerator 11. Rods are arranged in the second flange 16 to serve as displacement retainers 19 which slide in a third flange 20 located on the opposite side of the flange 16. Obviously it is also possible to fasten the displacement retainers 19 in the third flange 20 and to have them slidable in the first and second flanges 15, 16. The third flange 20 is part of a neck 21 formed on the outer shell 22 of the superconducting magnet system 10.

The outer shell 22 goes on the end sections of the superconducting magnet system 10 as a cover part with the end sections 23 having a test opening 24 on the axis 25 of the magnet system 10. It will be understood that the illustration of FIG. 3 also represents only one-half of the magnet system 10.

The sealing effect between the slidable refrigerator 11 and the cryostat can in accordance with the invention be formed either by means of O-rings 41, 42, arranged between the neck 21 and the tube 17 and/or by a bellows 43 between the neck 21 and flange 20. It will be understood that FIG. 4 is a simplified representation in which the two embodiments are both sketched. The actual embodiments are each rotationally symetrical.

In the representation of FIGS. 3 and 4 the refrigerator is shown in a moved out state. During the moving out of the refrigerator the tube 17 slides in the neck 21 from the in-place position in which the second flange 16 rests on the third flange 20 to the illustrated position which preferably can be recognized by a mark 136 applied to one of the displacement retainers 19 which indicates the moved out state of the refrigerator 11.

In this moved out condition of the refrigerator 11 the cooling arm 18 can next be brought to room temperature by means of a heating device 67 so that an exchange of mechanical parts, for example of seal elements is possible. The heating device 67 is, as seen in FIG. 4, arranged in an area which lies outside of the outer shell 22 when the refrigerator is in its moved out condition, so that the adverse effect of this heating on the inner parts, especially on the protective shields 26 and 29 is kept to a minimum.

In the moved out condition of the refrigerator 11 the vacuum sealing effect nevertheless is maintained so that no impairment of the vacuum in the intermediate spaces 33 takes place and therefore the magnet coil 32 can stay in its superconducting state.

When the mechanical service work on the refrigerator 11 is completed the refrigerator can be pushed back from the position shown in FIGS. 3 and 4 to its working position.

Figure 5A:
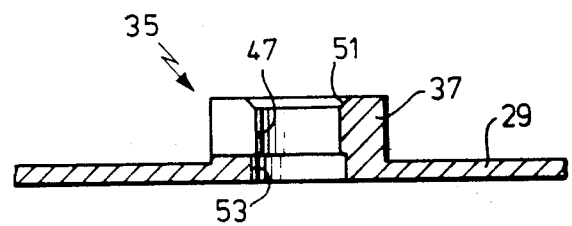
FIG. 5a and 5b are views of a preferred embodiment of a coupling part which can be used in the arrangement of FIGS. 3 and 4, with FIG. 5b being a plan view of the part and with FIG. 5a being a sectional view taken on the line a—a of FIG. 5b.
Figure 5B:
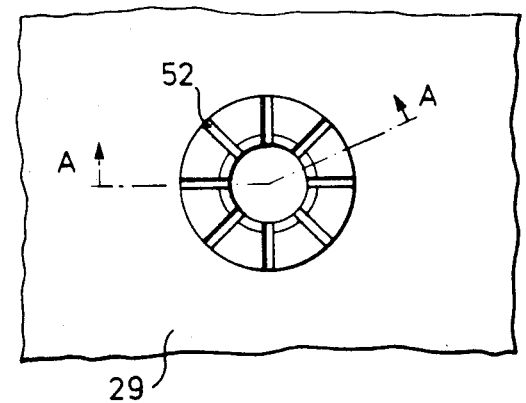

FIG. 5 illustrates an embodiment of a coupling part which for example can be used to form the coupling part 35, with FIG. 5a being a sectional view taken along the line a—a in FIG. 5b.

As will be recognized, the projection 37 is provided with the already mentioned central bore having the inner diameter 47, from which radial slots 52 pass through the projection 37. If the foot portion of the remainder of the projection 37 is reduced by means of a countersink with a diameter 53, which is greater than the diameter 57, there remains an elastic or springy crown type holder into which the finger 39 can be driven. Through the elastic holding of the finger 39 there is obtained a clamped connection between the projection 37 and the finger 39 giving an especially good heat conducting transfer.

We claim:

1. A cooling apparatus for a superconducting magnet, comprising:
    a magnet coil encircling a test space;
    an evacuated outer shell surrounding said magnet coil;
    an intermediate shield arranged between said magnet coil and said outer shell;
    a refrigerator with moving parts mounted on the outside of said outer shell, said refrigerator having a cooling arm extending through said outer shell and being in thermally conductive connection with said intermediate shield;
    sensing means for picking up magnetic and/or mechanical signals generated by said moving parts of said refrigerator during operation and for producing output signals related to said picked up magnetic and/or mechanical signals; and
    at least one additional coil to which said output signals of said sensing means are fed for compensating magnetic fields generated within said test space by said moving parts of said refrigerator.

2. A cooling apparatus according to claim 1 further characterized in that the sensing device is at least one detecting coil arranged in the area of the refrigerator.

3. A cooling apparatus according to claim 1 further characterized in that the sensing apparatus is at least one detecting coil arranged in the area of the test space.

4. A cooling apparatus according to claim 2 further characterized in that several detecting coils are provided which are effective in different gradient directions.

5. A cooling apparatus according to claim 2 further characterized in that the refrigerator has a cooling head containing the motorized drive which cooling head transitions into a first flange, that the outer shell has formed on it a neck transitioning into a second flange, that the flanges during the operation of the refrigerator engage one another and that the detecting coil is arranged in the area of the neck.

6. A cooling apparatus according to claim 5 further characterized in that said detecting coil is a solenoid coil axially surrounding the neck.

7. A cooling apparatus according to claim 1 further characterized in that the sensing apparatus surrounds a part which receives the acceleration or vibration of the refrigerator.

8. A cooling apparatus according to claim 1 further characterized in that the output signal of the sensing apparatus is delivered to the coil through an electronic control device.

9. A cooling apparatus according to claim 8 further characterized in that the control device weights said output signal.

10. A cooling apparatus according to claim 8 further characterized in that the control device includes a characteristic curve or characteristic line for converting the sensor signal into an output signal for the coil.

11. A cooling apparatus according to claim 1 further characterized in that the coil is formed as a correcting coil located in the area of the test space.

12. A cooling apparatus according to claim 11 further characterized in that the coil is formed as a correcting coil located in the area of the refrigerator.

13. A cooling apparatus according to claim 6 further characterized in a correcting coil located in the area of the refrigerator, and in that the correcting coil and the solenoid coil are arranged coaxial to one another.

14. A cooling apparatus according to claim 11 further characterized in that several correcting coils are provided which are effective in different gradient directions.

15. A cooling apparatus according to claim 10 further characterized in that in use at least one of the correcting coils is located in the area of the refrigerator and at least one is located in the area of the test space, and in that the control device in a first step controls the correcting coil in the area of the refrigerator and subsequently in a second step controls the correcting coil in the area of the test space.

16. A cooling apparatus according to claim 1 further characterized in that the passage through the outer shell is formed as a vacuum sealed sliding apparatus.

17. A cooling apparatus according to claim 16 further characterized in that the cooling arm is arranged in a tube belonging to the refrigerator which tube is slidable in a neck formed on the outer shell.

18. A cooling apparatus according to claim 17 further characterized in that at least one seal is provided between the neck and the tube.

19. A cooling apparatus according to claim 18 further characterized in that said seal is an O-ring.

20. A cooling apparatus according to claim 18 further characterized in that said seal is a bellows.

21. A cooling apparatus according to claim 17 further characterized in that the neck terminates in a flange which in the inserted condition of the refrigerator engages a flange of the refrigerator.

22. A cooling apparatus according to claim 21 further characterized in that one of the flanges has arranged in it rods which serve as displacement retainers which rods slide in the other flange.

23. A cooling apparatus according to claim 22 further characterized in that one displacement retainer has a mark indicating the moved out condition of the refrigerator.

24. A cooling apparatus according to claim 17 further characterized in that the refrigerator employs a head containing the cooling mechanism out of which head the cooling arm extends and which head is releasable from the tube.

25. A cooling apparatus according to claim 24 further characterized in that the head terminates in a flange which rests on the flange of the tube.

26. A cooling apparatus according to claim 25 further characterized in that between the flanges of the head and the tube is arranged a seal, preferably an O-ring.

27. A cooling apparatus according to claim 16 further characterized in that the cooling arm terminates in an end section with a finger reduced in size relative to the end section, which end section and finger in the inserted condition of the refrigerator stand in mechanical connection with at least two intermediate shields lying behind one another.

28. A cooling apparatus according to claim 27 further characterized in that at least one intermediate shield has a coupling part in which the end section or the finger is insertable.

29. A cooling apparatus according to claim 28 further characterized in that the coupling part consists of a preferably cylindrical projection of the intermediate shield which projection has a central bore the internal diameter of which matches the external diameter of the end section or finger.

30. A cooling apparatus according to claim 29 further characterized in that the bore on its end which faces the outer shell includes a bevel.

31. A cooling apparatus according to claim 27 further characterized in that the end section or the finger on its forward surface which faces the magnet coil has a bevel.

32. A cooling apparatus according to claim 28 further characterized in that the coupling part elastically receives the end section or finger.

33. A cooling apparatus according to claim 29 further characterized in that the cylindrical projection is provided with radial through going slots.

34. A cooling apparatus according to claim 33 further characterized in that the projection on its side which faces the magnet coil is provided with a countersunk diameter which is larger than the inner diameter of the bore.

35. A cooling apparatus according to claim 16 further characterized in that the cooling arm includes a heating device.

36. A cooling apparatus according to claim 35 further characterized in that the heating device and the portion of the cooling arm 18 requiring servicing lie in an area which in the moved out condition of the refrigerator is located outside of the outer shell.

37. A cooling apparatus according to claim 28 further characterized in that at least one coupling part is made of a material with good heat conducting properties at low temperatures.

* * * * *